(12) United States Patent
Kumar et al.

(10) Patent No.: US 9,722,623 B1
(45) Date of Patent: Aug. 1, 2017

(54) ANALOG-TO-DIGITAL CONVERTER WITH DYNAMIC ELEMENT MATCHING

(71) Applicant: STMicroelectronics International N.V., Amsterdam (NL)

(72) Inventors: Ashish Kumar, Ghaziabad (IN); Chandrajit Debnath, Greater Noida (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 0 days.

(21) Appl. No.: 15/382,813

(22) Filed: Dec. 19, 2016

(51) Int. Cl.
| H03M 1/34 | (2006.01) |
| H03M 1/46 | (2006.01) |
| H03M 1/12 | (2006.01) |
| H03M 1/06 | (2006.01) |

(52) U.S. Cl.
CPC ......... H03M 1/466 (2013.01); H03M 1/0626 (2013.01); H03M 1/1245 (2013.01)

(58) Field of Classification Search
CPC ... H03M 1/466; H03M 1/0626; H03M 1/1245
USPC .................................................. 341/150–160
See application file for complete search history.

(56) References Cited

U.S. PATENT DOCUMENTS

| 5,635,934 A * | 6/1997 | Brown | G11B 20/10009 |
| | | | 341/118 |
| 5,638,072 A * | 6/1997 | Van Auken | H03M 1/804 |
| | | | 341/141 |
| 6,346,905 B1 * | 2/2002 | Ottini | H03M 1/0809 |
| | | | 341/159 |
| 6,414,615 B1 * | 7/2002 | Cheng | H03M 3/37 |
| | | | 341/143 |
| 6,426,714 B1 * | 7/2002 | Ruha | H03M 1/066 |
| | | | 341/118 |
| 6,473,019 B1 * | 10/2002 | Ruha | H03M 3/334 |
| | | | 341/143 |
| 2010/0245147 A1 * | 9/2010 | Souda | H03M 3/37 |
| | | | 341/155 |

OTHER PUBLICATIONS

Shettigar, P. et al., "Design Techniques for Wideband Single-Bit Continuous-Time ΔΣ Modulators with FIR Feedback DACs," IEEE Journal of Solid-State Circuits, vol. 47, No. 12, Dec. 2012, pp. 2865-2879.

(Continued)

*Primary Examiner* — Lam T Mai
(74) *Attorney, Agent, or Firm* — Slater Matsil, LLP

(57) ABSTRACT

An embodiment ADC device includes a plurality of comparator elements, each comparator element of the plurality of comparator elements having a first input connected to an input port, each comparator element of the plurality of comparator elements having a second input port connected to a reference signal port. The ADC device further has a switch matrix having routing circuitry connected to an output of each comparator of the plurality of comparators, and a plurality of latches, with each latch of the plurality of latches having an input connected to the routing circuitry. The routing circuitry is configured to connect the output of each comparator of the plurality of comparators to an input of each latch of the plurality of latches according to one or more signals received at one or more control ports.

20 Claims, 16 Drawing Sheets

(56) References Cited

OTHER PUBLICATIONS

Yoon, D.Y. et al ., "An 85dB-DR 74.6dB-SNDR 50MHz-BW CT Mash ΔΣ Modulator in 28nm CMOS," ISSCC 2015/Session15/Data-Converter Techniques/15.1., 2015 IEEE International Solid-State Circuits Conference, Feb. 2015, pp. 271-273.

* cited by examiner

ANALOG-TO-DIGITAL CONVERTER WITH DYNAMIC ELEMENT MATCHING

TECHNICAL FIELD

The present invention relates generally to a system and method for analog-to-digital signal processing, and, in particular embodiments, to a system and method for providing analog-to-digital signal processing using dynamic element matching in a reset clock phase of a quantizer.

BACKGROUND

Generally, conversion of analog signals to digital signals involves determining a discrete value of the analog signal, and then converting the discrete value into a digital value. In some analog-to-digital converters (ADCs), a quantizer is used to determine the discrete value of the analog signal. Some ADCs use a feedback loop to correct the incoming signal to eliminate noise or correct for imperfections in the ADC hardware. However, since the incoming signal is analog, and the output signal is digital, a digital-to analog converter (DAC) is used in the feedback loop to convert the digital feedback signal back into an analog signal to correct the analog input signal. However, a DAC, particularly a multibit DAC, may be nonlinear due to a mismatch in the DAC elements. Dynamic element matching (DEM) is used to vary the elements in the DAC used to convert each bit, averaging out any errors in the DAC elements. That is, the DEM will change which DAC elements provide each bit so that any error in a particular DAC element is not consistently applied to the same bit.

SUMMARY

An embodiment ADC device includes a plurality of comparator elements, each comparator element of the plurality of comparator elements having a first input connected to an input port, each comparator element of the plurality of comparator elements having a second input port connected to a reference signal port. The ADC device further has a switch matrix having routing circuitry connected to an output of each comparator of the plurality of comparators, and a plurality of latches, with each latch of the plurality of latches having an input connected to the routing circuitry. The routing circuitry is configured to connect the output of each comparator of the plurality of comparators to an input of each latch of the plurality of latches according to one or more signals received at one or more control ports.

An embodiment ADC device includes a symbol combiner connected to an input port, a quantizer connected to the symbol combiner, the quantizer including a plurality of comparator elements configured to determine relationships between a signal received at a quantizer input port and one or more reference signals and to generate one or more active data signals according to the relationships. The quantizer further includes a switch matrix having routing circuitry connected to each comparator element of the plurality of comparator elements, and a plurality of latches, with each latch of the plurality of latches connected to the routing circuitry. The routing circuitry is configured to connect each comparator element of the plurality of comparator elements to each latch of the plurality of latches according to one or more signals received at one or more control ports of the switch matrix. The ADC device further has a digital-to-analog converter (DAC) connected, in a first feedback loop to an output of the quantizer and to the symbol combiner, and a dynamic element matching (DEM) module connected, in a first feedback path, to the switch matrix and the output of the quantizer. The DEM module is configured to provide control signals through the one or more control ports to the switch matrix that cause the switch matrix to provide routing that connects each comparator element of the plurality of comparator elements to one respective, different, latch of the plurality of latches.

An embodiment ADC device includes a plurality of comparator elements. Each comparator element is configured to generate an active data signal according to a relationship between an input signal and a reference signal. The ADC device further includes a plurality of latches, and a switch matrix having control ports and connected between the plurality of comparators and the plurality of latches, the switch matrix having routing circuitry configured to connect each comparator to each latch according to one or more control signals received at the control ports and cause the latch to latch a data value according to the data signal generated by the respective comparator connected to the latch. The ADC device further comprises a processing module connected to the latches and configured to generate a digital output signal according to the data values stored by the plurality of latches.

An embodiment method includes receiving, at an input of each comparator of a plurality of comparators, an input signal, quantizing a first input value of the input signal in a first clock cycle by determining a first relationship of the first input value, at each comparator of the plurality of comparators, to a respective reference signal, and generating first data signals according to the first relationships, and passing the first data signals through a switch matrix to a plurality of latches according to routing of the switch matrix. The routing connects each comparator of the plurality of comparators to a different latch of the plurality of latches, and the routing is set according to first routing information.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
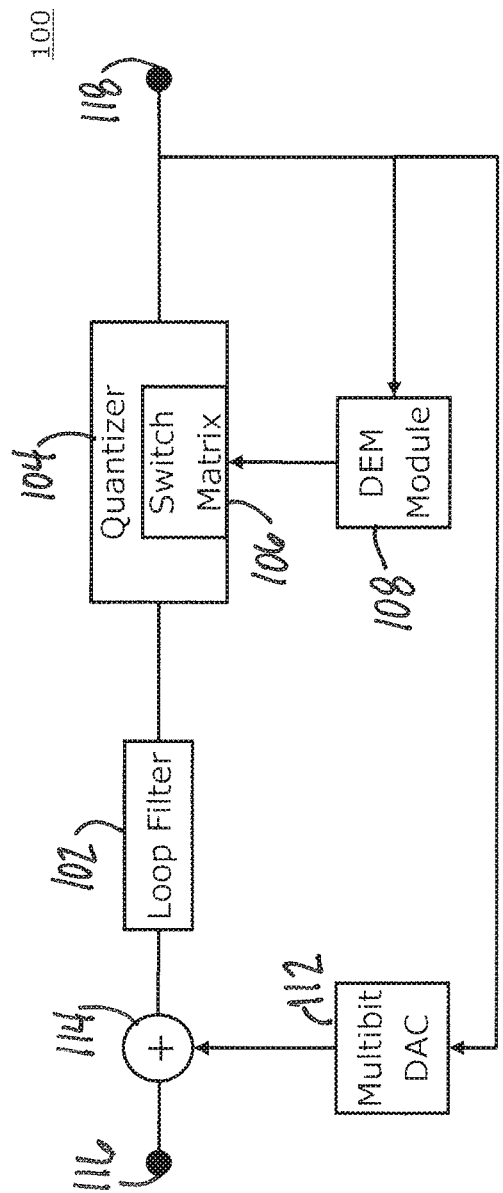
FIG. 1 is a diagram illustrating a system with a quantizer and dynamic element matching according to some embodiments.

Analog-to-digital converters (ADCs) use a quantizer to generate a set of discrete signals indicating a voltage level of an analog signal. In some ADCs, the analog signal is compared to different reference voltages, and the signals indicating the results of the comparisons are provided to latches. The latches store the result values to indicate the discrete values of the analog signal for DAC elements. In some embodiments of the presented principles, dynamic element matching is performed during the quantization process, avoiding delay that would be introduced in a system where DEM is performed in a feedback loop for adjusting the input analog signal.

Additionally, performing DEM at the quantizer permits the use of DEM in a multibit ADC, avoiding the use of a 1-bit quantizer, which has inherent linearity but low dynamic range, more jitter sensitivity, and a high slew rate requirement for operational amplifier elements. The DEM of the embodiments is performed in parallel with the digital-to-analog converter (DAC) in the analog signal feedback loop so that the DEM is applied to the adjusted and filtered analog signal. This avoids the excess loop delay (ELD) introduced with DEM and multibit DAC processing in the same feedback loop.

Embodiments of the presented principles are directed to providing DEM by controlling a switch matrix disposed in the quantizer. The DEM is applied separately from the feedback through a multibit DAC for adjustment of the analog input signal. The switch matrix rotates or changes the connections between comparators and latches/DAC elements in the quantizer so that imperfections or mismatches in DAC elements are averaged across different output bits.

The input signal is sampled by the comparators at a rising edge of a clock signal, and the comparators quantize the input value by generating discrete values for the analog input signal when a clock signal is high. The switch matrix is reset when the clock signal is low. The DEM is introduced in the reset phase of the comparators, and after quantizer delay, output data goes to the feedback path. The quantizer output is provided to the DEM logic and the DEM logic selects the connections of the comparator outputs D-flip flops and DAC elements in the reset phase itself. When the comparators of the quantizer are in a reset phase when the clock is low, the DEM uses the switch matrix to connect the D-flip flops and DAC elements depending upon the previous data and the previous switch matrix routing. When the clock signal is high, the comparators in the quantizer determine the discrete value of the input signal and pass associated signals to respective DAC elements that are selected or determined by the DEM logic in the reset phase. This avoids delay introduced by DEM logic in the feedback path to the analog signal input. Thus, the switch matrix routing is set in half of a clock cycle, and the analog signal is processed into a digital output value in the other half of the clock cycle, significantly improving the speed of the ADC and the bandwidth that can be handled. Additionally, the maximum sampling frequency is limited by the quantizer's latency, avoiding delay cause by the DEM logic.

FIG. 1 is a diagram illustrating a system 100 with a quantizer 104 and dynamic element matching according to some embodiments. In an embodiment, the system 100 is an ADC using flash architecture, however, in other embodiments, other ADC architectures may be used. The system 100 has an analog input 116 that is connected to a signal combiner 114. The signal combiner 114 modifies an analog input signal based on an analog feedback signal to generate an adjusted signal that is provided to a loop filter 102. In some embodiments, the loop filter 102 removes unwanted high frequency components and is, for example, a phase locked loop (PLL) filter, active or passive loop filter, or another type of filter. The loop filter 102 provides a filtered signal to the quantizer 104, which has a switch matrix 106. The quantizer 104 provides a digital output signal at a digital output 118.

The digital output signal is also provided to two feedback elements. A multibit DAC 112 receives the digital output signal and converts the digital output signal to an analog feedback signal, which is provided to the signal combiner 114. The digital output signal is also provided to a digital feedback loop that is separate from the analog feedback loop having the multibit DAC 112. Feedback from the digital output signal is provided to a DEM module 108. In some embodiments, the feedback from the digital output signal is provided to the DEM module 108 through a delay (not shown here for clarity). The DEM module 108 uses the feedback from the digital output signal to set routing circuitry of the switch matrix 106 and make connections between comparators in the quantizer 104 and latches and associated DAC elements. In some embodiments, the DEM module 108 tracks the digital output signal, the state of the switch matrix routing, or another tracking variable so that the digital output signal may be applied to, or used to modify, the previous state of the switch matrix 106 routing.

Figure 2A:
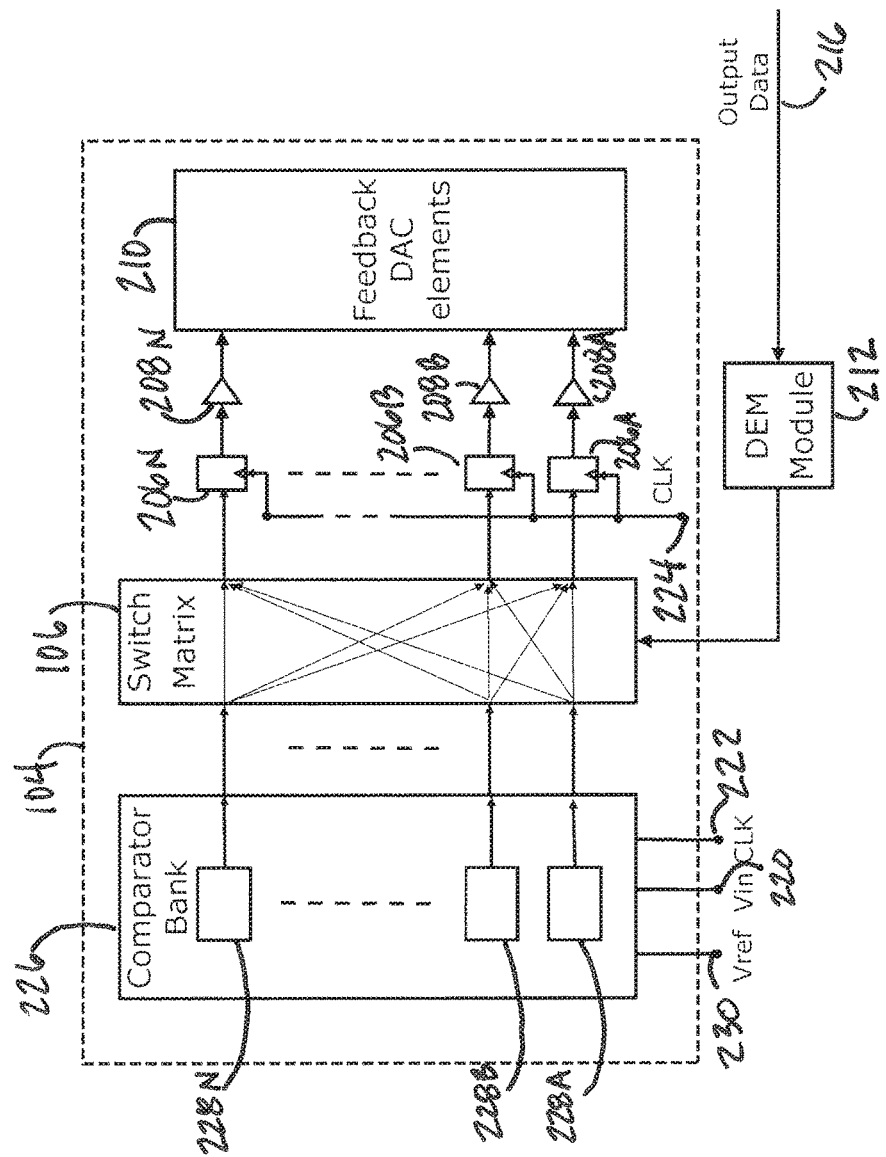
FIGS. 2A through 2D are diagrams illustrating a quantizer with a switch matrix controlled by a dynamic element matching module according to some embodiments.

FIG. 2A is a logical diagram illustrating a quantizer 104 with a switch matrix 106 controlled by a DEM module 212 according to some embodiments. In an embodiment, the quantizer 104 has a comparator bank 226 having a plurality of comparator elements 228A . . . 228N that operate on an input voltage received at input Vin 220.

The comparator elements 228A . . . 228N each provide an output through routing circuitry in the switch matrix 106 to latches 206A . . . 206N that latch and hold the output values from the comparator elements 228A . . . 228N. Each comparator element 228A . . . 228N determines a relationship between the input signal and the reference signal. In some embodiments, each comparator element 228A . . . 228N that receives a reference voltage that is at, or lower than, the input signal generates a high output signal, or a logical "1", and each comparator element 228A . . . 228N that receives a reference voltage that is greater than the input signal generates a low output signal, or a logical "o".

The switch matrix 106 of the quantizer 104 connects each of the comparator elements 228A . . . 228N to the latches 206A . . . 206N according to signals from the DEM module 212. The DEM module 212 causes each comparator element 228A . . . 228N to be connected to a single latch 206A . . . 206N, and each comparator element 228A . . . 228N is connected to a different latch 206A . . . 206N. The routing of the connections between the comparator element 228A . . . 228N and the latches 206A . . . 206N may be reset or adjusted when the clock signal is low based on a feedback signal received at a feedback port 216 that is passed to the DEM module 212. Thus, a first part of a clock signal where the comparator elements 228A . . . 228N and latches 206A . . . 206N process an input signal may be a decision phase, and a second part of the clock signal where the DEM sets the switch matrix 106 routing may be a reset phase. While the decision phase is described as being a high clock signal phase, and the reset phase is described as being a low clock signal phase, it should be understood that the embodiments are not limited to such an arrangement, and the reverse may also be used in some embodiments.

The latches 206A . . . 206N receive logic signals or active/inactive data signal from the comparator elements 228A . . . 228N through the switch matrix 106 according to the routing in the switch matrix 106. The latches 206A . . . 206N may, in some embodiments, be D-flip flops, but in other embodiments, may be JK latches or flip flops, set/reset (SR) latches, T flip flops or other circuits or elements that store state information. In some embodiments, the latches 206A . . . 206N may be enabled or reset by a clock signal on a clock line 224. The latches 206A . . . 206N latch and hold the data signals, and provide the latched data signals, in some embodiments, through buffers 208B to feedback DAC elements 210. In some embodiments, the feedback DAC elements 210 may process the data signals from the latches 206A . . . 206N to provide feedback signals to a filter or signal combiner. Additionally, the data signals from the latches may also be encoded or otherwise processed to generate a digital bitstream representation of the input signal.

Figure 2B:
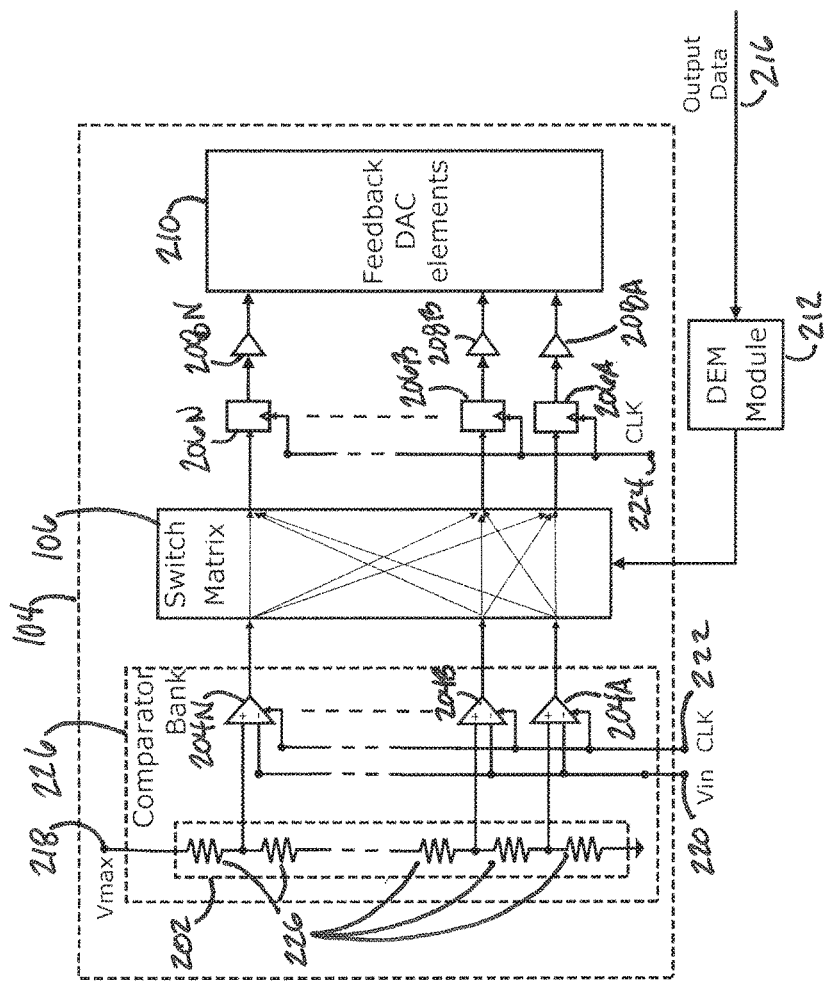

FIG. 2B is a logical diagram illustrating a resistive flash ADC quantizer 104 with a switch matrix 106 controlled by a DEM module 212 according to some embodiments. In a resistive flash ADC embodiment, each comparator element in the comparator bank 226 may be a comparator that directly compares the input voltage to a reference voltage. A reference voltage circuit 202 provides a reference voltage or reference signal to each of a plurality of comparators 204A . . . 204N. The reference voltage circuit 202 provides discrete samples of a maximum reference voltage Vmax received at a reference port 218. In some embodiments, the reference voltage circuit 202 is a voltage ladder or voltage divider circuit with one or more resistors 226 in series. The resistors 226 have substantially equal resistive values, so that the voltage drop across each resistor 226 is substantially the same, and the voltage at each node between the resistors 226 represents a substantially proportional sample of the maximum reference voltage Vmax.

Each comparator 204A . . . 204N has a first input connected to a node in the reference voltage circuit 202 and receives a reference voltage. The comparators 204A . . . 204N also each have a second input connected to an input Vin 220, and the second inputs receive an input signal through the input Vin 220. The comparators 204A . . . 204N compare the reference voltage to the input signal and generate an output based on the comparison. In some embodiments, a clock line 222 is also connected to each of the comparators 204A . . . 204N so the comparison process at each comparator 204A . . . 204N may be enabled or disabled. In some embodiments, the comparators are enabled on a rising edge of a clock signal or when the clock signal is high in a decision phase of the clock signal.

The comparators 204A . . . 204N provide the output through routing circuitry in the switch matrix 106 to latches 206A . . . 206N that latch and hold the output values from the comparators 204A . . . 204N. Each comparator 204A . . . 204N receives a different reference voltage and from the reference voltage circuit 202 and compares the respective reference voltage to the input signal to generate a logical "1" or "o". For example, the reference voltage circuit 202 may provide, based on the max reference voltage, reference signals at 1 volt increments, i.e., 1 volt at the first node, 2 volts at the second node, and the like. A 1 volt input signal would cause the first comparator 204A to output a logical "1" since the input signal at 1 volt is equal to the 1 volt reference signal at the first node. The second comparator 204B would output a logical "o" since the input signal at 1 volt is lower than the 2 volt reference signal at the second node.

Figure 2C:
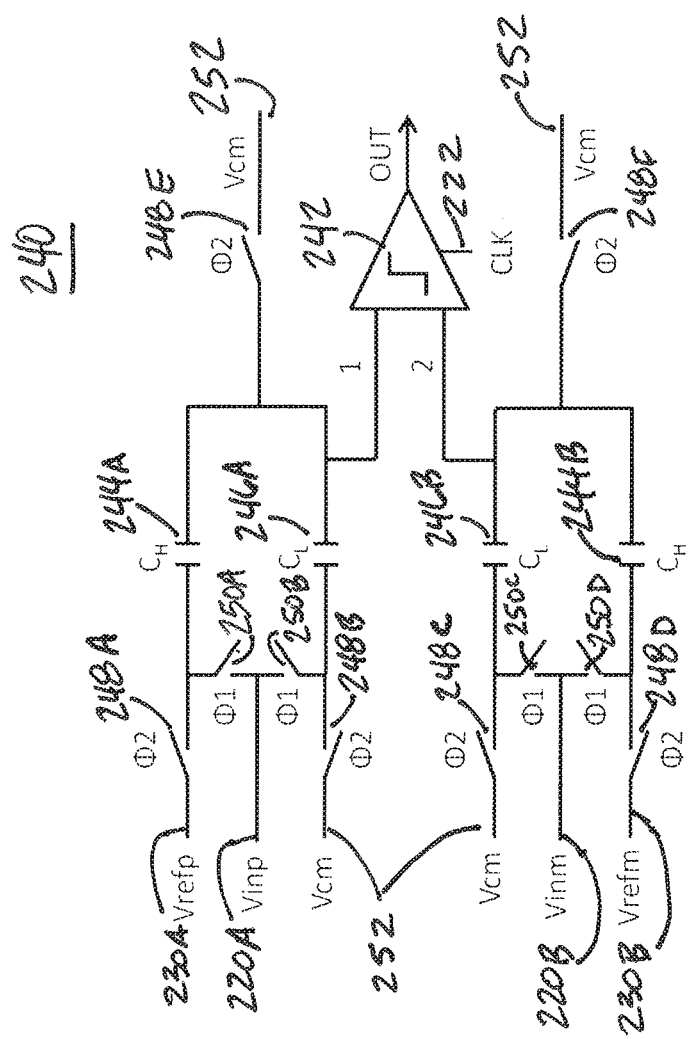

FIG. 2C is a diagram illustrating a switched capacitor comparator element 240 for a quantizer 104 with a switch matrix 106 according to some embodiments. A first portion of the switched capacitor comparator element 240 compares or determines a relationship between a positive input voltage Vinp 220A and a positive reference voltage Vrefp 230A, and is reset by a common mode voltage Vcm 252. A second portion of the a switched capacitor comparator element 240 compares or determines a relationship between a negative input voltage Vinm 220B and a negative reference voltage Vrefp 230B, and is also reset by the common mode voltage Vcm 252. The switched capacitor comparator element 240 has first phase switches 250A . . . 250D operated according to a first control signal and second phase switches 248A . . . 248F operated according to a second control signal.

The first phase switches 250A . . . 250D connect each of the positive and negative input voltages Vinp 220A and Vinm 220B to first ports of high side capacitors 244A and 244B and to first ports of low side capacitors 246A and 246B. The second phase switches 248A . . . 248D connect the common mode voltage Vcm 252 and positive and negative reference voltages 230A and 230B to the first ports of high and low side capacitors 244A, 244B, 246A and 246B. The first and second phase switches 250A . . . 250D and 248A . . . 248D cause the high and low side capacitors 244A, 244B, 246A and 246B to have a voltage indicating whether the positive input voltage Vinp 220A is proportionally higher than the positive reference voltage Vrefp 230A and whether the negative input voltage Vinm 220B is proportionally lower than the negative reference voltage Vrefm 230B. Additional second phase switches 248E and 248 F connect the second port of the high and low side capacitors 244A, 244B, 246A and 246B to the common mode voltage Vcm 252 to reset the voltage across the high and low side capacitors 244A, 244B, 246A and 246B.

The second ports of the high and low side capacitors 244A and 246A in the first portion of the switched capacitor comparator element 24o provide an output to a first port of the comparator 242. The second ports of the high and low side capacitors 244B and 246B in the second portion of the a switched capacitor comparator element 240 provide an output to a second port of the comparator 242. The comparator 242 then compares the signals from the first and second portions of the comparator element 24o, and generates an output indicating the relationship of the input signal to the reference signal.

Figure 2D:
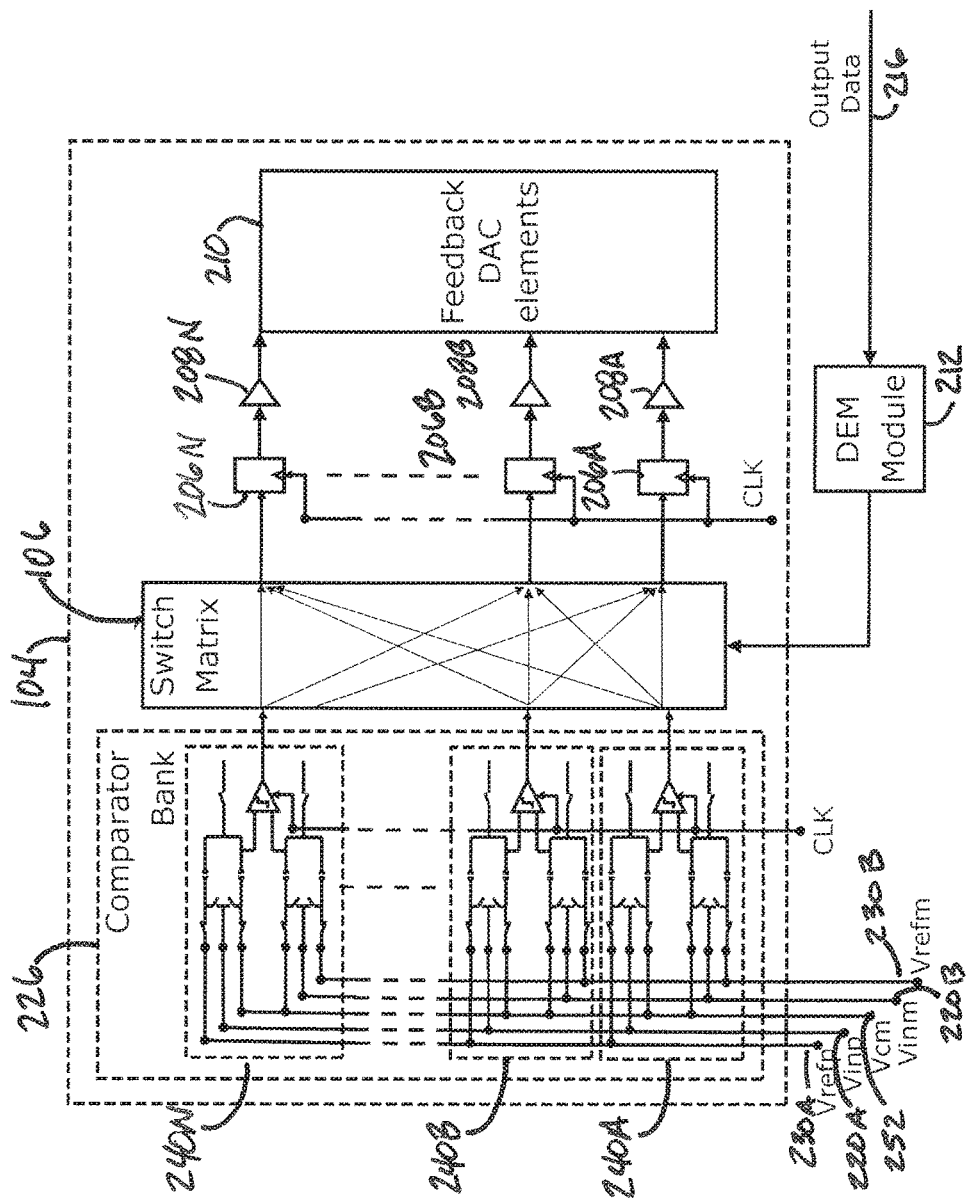

FIG. 2D is a logical diagram illustrating a switched capacitor flash ADC quantizer 104 with a switch matrix 106 controlled by a DEM module 212 according to some embodiments. In a switched capacitor flash ADC embodiment, each comparator element in the comparator bank 226 may be a switched capacitor comparator element 240A . . . 240N that compares positive and negative input voltages Vinp 220A and Vinm 220B to respective positive and negative reference voltages Vrefp 230A and Vrefm 230B. The reference voltages Vrefp 230A and Vrefm 230B are signals received at a reference signal port and the input voltages Vinp 220A and Vinm 220B are received at an input port. Each switched capacitor comparator element 240A . . . 240N provides an output to the switch matrix 106 for routing to the latches 204A . . . 204N In some embodiments, each switched capacitor comparator element 240A . . . 240N uses the same reference signals Vrefp 230A and Vrefm 230B. The capacitors in each switched capacitor comparator element 240A . . . 240N may be sized or formed so that the switched comparator elements 240A . . . 240N determine the relationship between the input signal and a desired proportion of the reference signals. Thus, individually tailored reference signals are not needed for each a switched capacitor comparator element 240A . . . 240N. However, in other embodiments, individual reference signals are provided to each a switched capacitor comparator element 240A . . . 240N.

Figure 3A:
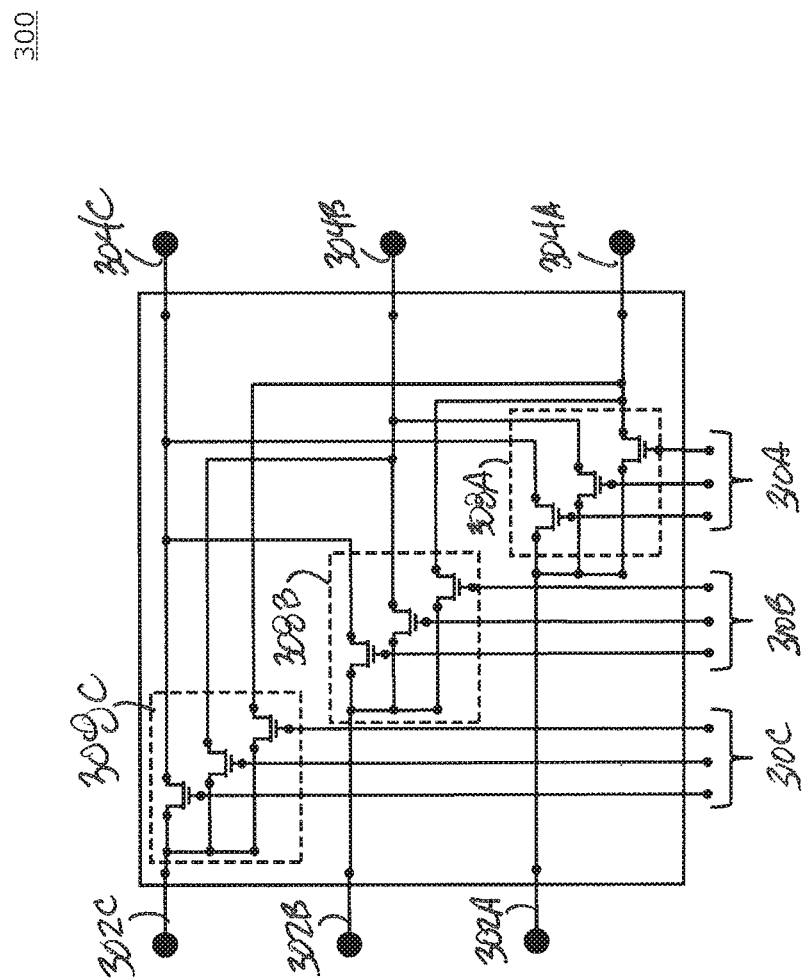
FIGS. 3A and 3B are circuit diagrams illustrating switch matrices according some embodiments.
Figure 3B:
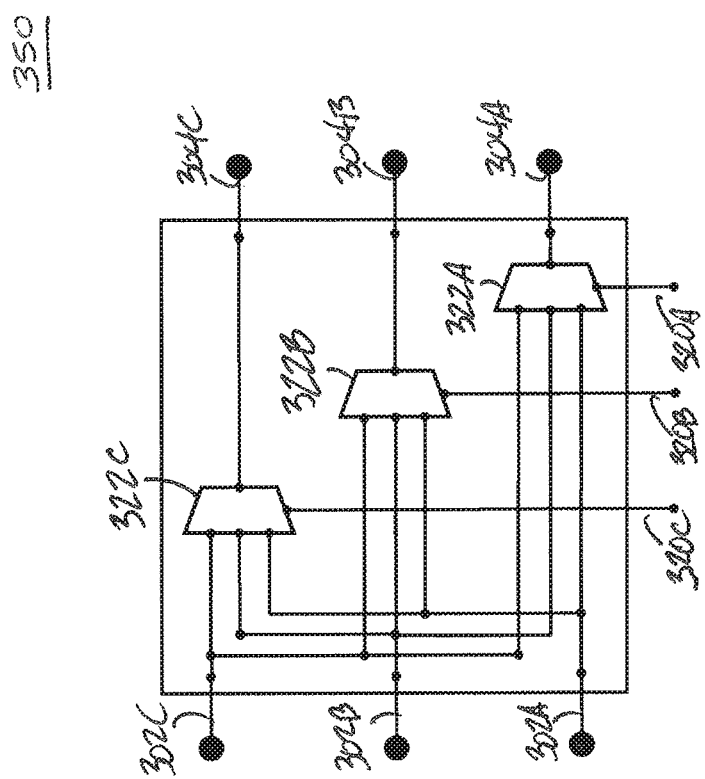

FIGS. 3A and 3B are a circuit diagrams illustrating switch matrices according to some embodiments. The illustrated switch matrices have routing circuitry that connects the inputs to the outputs according to control signals, and may be disposed between comparators and latches to route signals from the comparators to the latches. In particular, FIG. 3A is a circuit diagram of an embodiment transistor based switch matrix 300. The particular embodiment of the switch matrix 300 is described in terms of metal oxide field effect transistors (MOSFETs), but may be implemented in junction field effect transistors (JFETs), switches, or other switching elements. In some embodiments, the transistors are n-channel MOSFETs that are normally off, or are off when the gate voltage is about zero.

Each input 302A . . . 302C has an associated transistor group 308A . . . 308C, and each transistor group 308A . . . 308C has one or more transistor that connect each of the inputs 302A . . . 302C to each of the outputs 304A . . . 304C. The gates of each transistor in each transistor group 308A . . . 308C are connected to control inputs in control input groups 310A . . . 310C. The DEM module turns on one transistor in each transistor group 308A . . . 308C so that each input 302A . . . 302C is connected to only one output 304A . . . 304C. Additionally, in this embodiment, the circuit is simple and high speed, and the DEM module tracks and controls the routing provided by the transistor groups 308A . . . 308C so that each input 302A . . . 302C is connected to a different output 304A . . . 304C. The DEM module controls the transistors by providing a high control signal through the control inputs of the control input groups 310A . . . 310C so that one transistor in each transistor group 308A . . . 308C is turned on or conducting between a particular input 302A . . . 302C and a particular output 3-4A . . . 304C.

FIG. 3B is a circuit diagram of an embodiment multiplexer based switch matrix 350. In some embodiments, the connections between the inputs 302A . . . 302C and the outputs 304A . . . 304C are controlled by multiplexers 322A . . . 322C. The selector inputs of each multiplexer 322A . . . 322C are connected to selector control inputs 320A . . . 320C, and the DEM module provides a selection signal to each multiplexer 322A . . . 322C to route each input 302A . . . 302C to a separate and distinct output 304A . . . 304C.

Figure 4A:
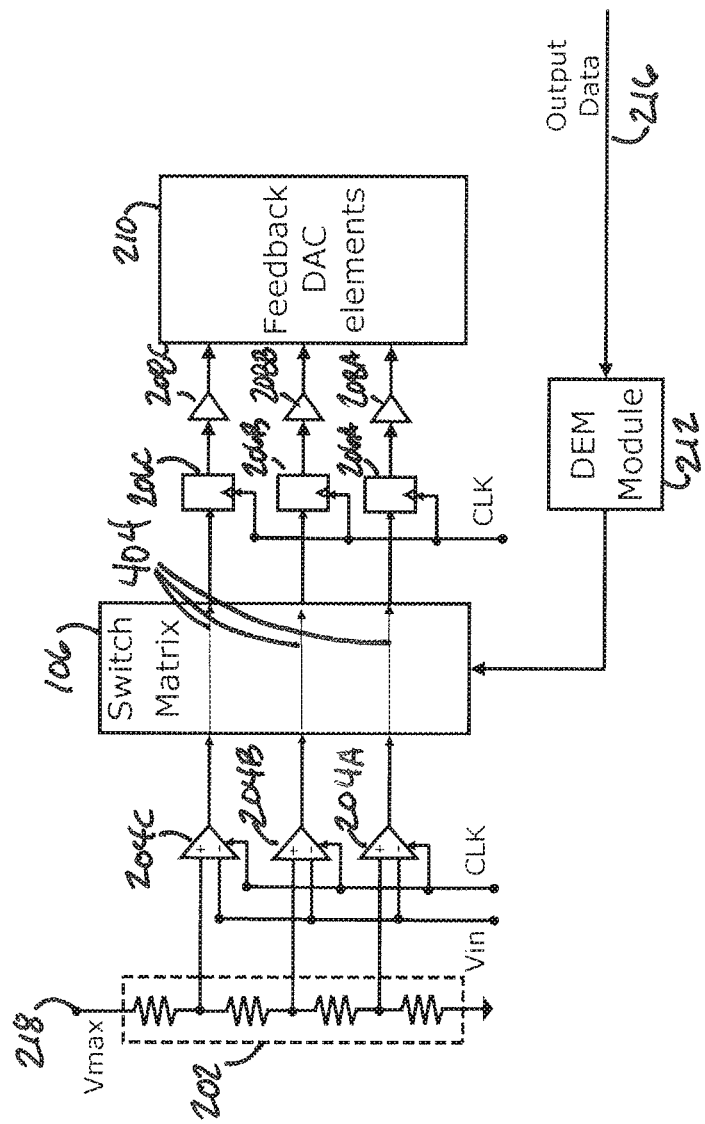
FIGS. 4A through 4H are diagrams illustrating the operation of a quantizer with a switch matrix according to some embodiments.

FIGS. 4A through 4H are diagrams illustrating the operation of a quantizer 104 with a switch matrix 106 according to some embodiments. In the disclosed embodiments, a 2-bit quantizer with resistive flash comparator elements is shown. However, other embodiments may have circuitry and elements for handling any number of bits, and the 2-bit embodiments shown are non-limiting embodiments illustrated to explanation of the operation of the quantizer. Additionally, other types of comparator elements may be used, as the resistive flash comparator elements are not intended to be limiting. In particular, FIG. 4A is a diagram illustrating the quantizer 104 with the switch matrix 106 in an initial state. In some embodiments, the DEM module 212 initially sets routing circuitry of the switch matrix 106 to have a default or initial routing 404 arrangement. Thus, the initial routing 404 in the switch matrix may, in some embodiments, not be based on previous data values. In an embodiment, the DEM module 212 sets the routing 404 of the switch matrix 106 so that the first comparator 204A is connected to the first latch 206A, the second comparator 204B is connected to the second latch 206B, and the third comparator 204C is connected to the third latch 206C. The initial or default state of the switch matrix 106 may be set by the DEM without regard for the clock signal, before an input signal is received at the input Vin 220, after a timeout, after receiving a reset signal at the DEM module, or according to another condition.

Figure 4B:
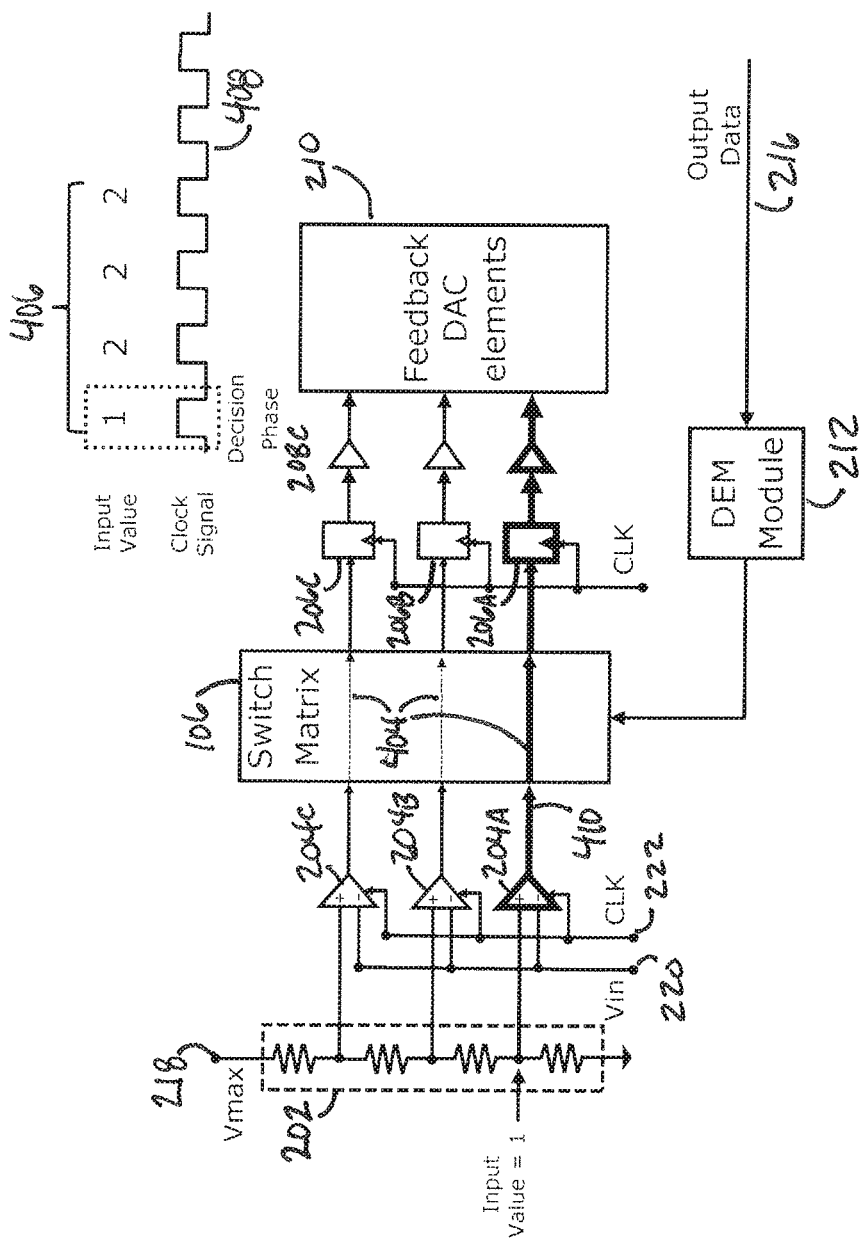

FIG. 4B is a diagram illustrating operation of the quantizer and switch matrix 106 during a decision phase of a clock signal 408. The clock signal 408 may be received at the clock line 222, and a decision phase of the clock signal 408 is, in some embodiments, the high portion of the clock signal 408.

A first input value of an input signal 406 are received at input Vin 220. The comparators 204A . . . 204C compare the input value to the respective reference voltage provided to the comparators 204A . . . 204C by the reference voltage circuit. In the illustrated embodiment, the maximum reference voltage Vmax may be 4 volts, so that the reference voltages have a 1 volt step when divided among the resistors in the reference voltage circuit 202. Thus, the reference voltage provided to the first comparator is 1 volt, the reference voltage provided to the second comparator 204B is 2 volts, and the reference voltage provided to the third comparator 204C is 3 volts. Additionally, in the illustrated embodiment, the input value is 1 volt. The first comparator 204A determines that the 1 volt input value is equal to or greater than the 1 volt reference voltage, and generates a "1" bit value, which may be referred to as a positive bit value or active data signal. The positive bit value is indicated by an active data signal 410. The second and third comparators 204B 204C determine that the input value of 1 volt are less than the respective reference voltages of 21 volts and 3 volts, and output a "o" bit value, which may be a low bit value or negative bit value, which may be indicated by inactive or floating data signals. The active data signal 410 is passed to the switch matrix 106 where the routing 404 provides the active data signal to the first latch 206A, where it is latched and passed to the first buffer 208A and on to the feedback DAC elements 201. The comparators 204A . . . 204C and latches 206A . . . 208C are activated by the positive portion of the clock signal so that the comparison of the input value and reference values are performed, and the resulting data signals are latched, in the decision phase of the clock signal 408. In some embodiments, the comparisons by the comparators 204A . . . 204C may be triggered by the rising edge of the clock signal, and the latches 208A . . . 208C may latch the signals passed through the switch matrix on the falling edge of the clock signal 408. Thus, the frequency or period of the clock signal may depend on, or at least, be larger than, the propagation delay through the comparators 204A . . . 204C, switch matrix 106, and latches 206A . . . 206C.

In some embodiments, the DEM module 212 tracks the routing 404 in the switch matrix 106 and provides routing information regarding the routing 404 to the feedback DAC elements 210 so that the feedback DAC elements are able to determine that an active signal represents a particular voltage level. The feedback DAC elements 210 may use the routing information to route the incoming active data signals from the latches to particular inputs of an encoder to generate a binary output signal. In other embodiments, the feedback DAC elements 210 are configured to count the number of active data signals 410 sent received, and determine the voltage level from the number of received active signals. In an embodiment, the feedback DAC elements 210 may determine the value of the input signal, since the voltage level of the input signal is directly proportional to the number of active data lines the number of active data signals 410. Thus, a single active data signal 410 corresponds to a 1 volt input value, two active data signals 410 correspond to a 2 volt input signal value, and the like. In another embodiment, the feedback DAC 210 elements may count the number of active data signals and generate an encoded output value based on the number of active data signals using, for example, a priority encoder, an adder, or the like.

Figure 4C:
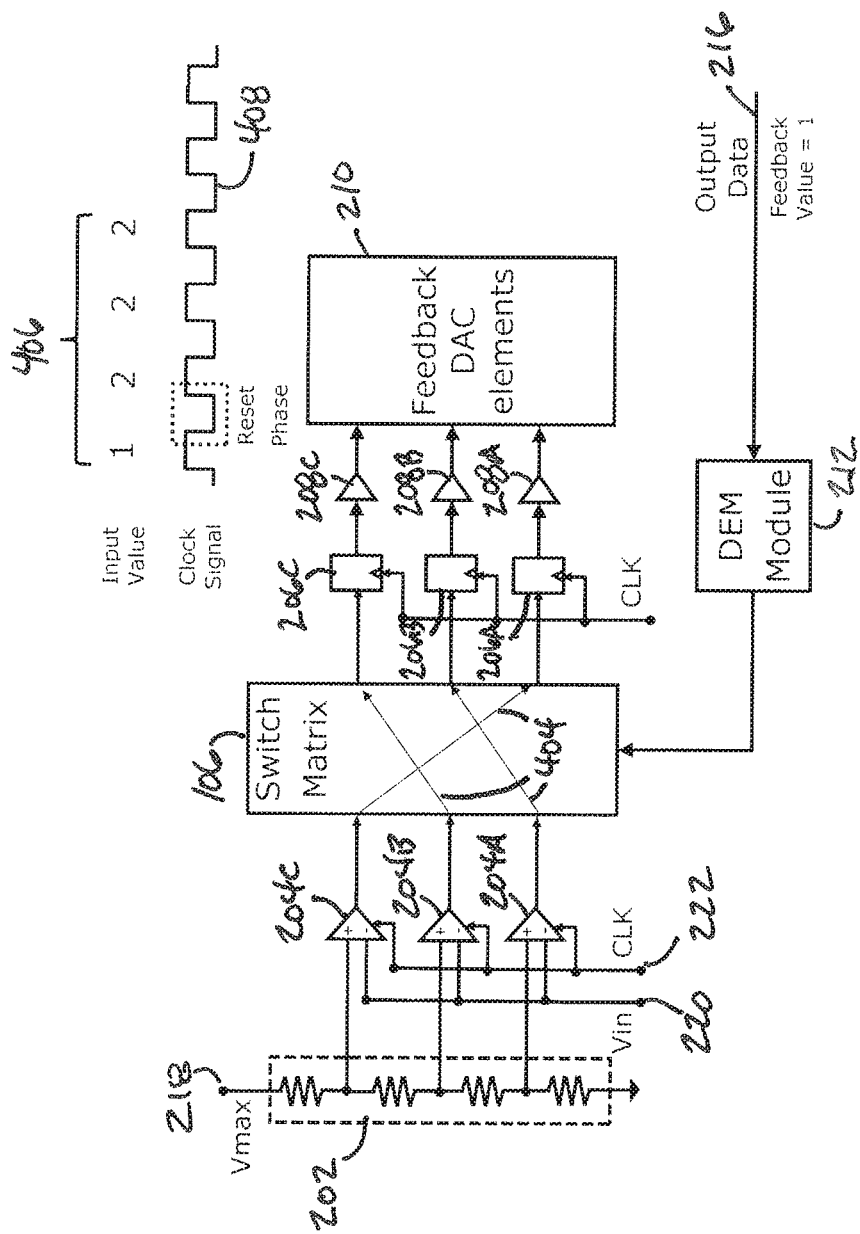

FIG. 4C is a diagram illustrating operation of the quantizer and switch matrix 106 during a reset phase of a clock signal 408. A reset phase of the clock signal 408 is, in some embodiments, the low portion of a cycle in the clock signal 408.

The input values of the input signal are not used during the reset phase, and the input value may change from the preceding value. The output of the quantizer generated by the preceding input value is received at the feedback port 216 and is provided, in some embodiments, to the DEM module 212. In the illustrated embodiment, the preceding input value was a 1, and the feedback value is a 1, accordingly. In some embodiments, the DEM module 212 uses the feedback value to adjust the routing of the switch matrix 106. The DEM module 212 may use a routing assignment system based on the previous routing, based on the previous data value, based on the previous routing and previous data value, or based on another value. For example, the DEM module 212 may use a round robin routing assignment system where the comparators 204A . . . 204C are connected each reset phase to a next or subsequent latch 206A . . . 206C in a list. In another example, the DEM module 212 may use a routing assignment system based on the feedback data value on a data averaging system, so that the connections between the comparators 204A . . . 204C and the latches 206A . . . 206C are incremented by the feedback value, and each latch 206A . . . 206C is used to provide an active data signal an equal number of times. In yet another example, the DEM module 212 randomly assigns the connections between the comparators 204A . . . 204C and latches 206A . . . 206C in a random assignment system.

In the illustrated embodiment, the DEM module 212 uses a data averaging system to assign the routing based on the feedback data value. Previously, in the first decision phase, the first comparator 204A was connected to the first latch 206A. The DEM module 212 tracks the previous routing and increments the routing 404 according to the feedback value. With the feedback value being 1, the DEM module 212 increments the routing 404 by 1, and connects the first comparator 204A to the second latch 206A, the second comparator 204B to the third latch 206C, and the third comparator 204C to the first latch 206A. Since the first latch 204A handled the only active data signal, at least the second latch 204B will handle the next active data signal.

In some embodiments, the DEM module 212 may track an assignment number in an accumulator, with the assignment number being divided by the number of latches to generate a remainder indicating the latch to which, for example, the first comparator 204A should be connected. The remaining comparators 204B . . . 204C may then be assigned based on the assignment determined for the first comparator 204A. In other embodiments, the assignment of one or more of the comparators 204A . . . 204C may be tracked by rotating values through a register, or using another tracking system. In some embodiments, the DEM module 212 performs tracking of the routing information using discrete hardware circuitry or elements such as an accumulator, a register or the like, or stores the routing information in a computer readable medium.

Figure 4D:
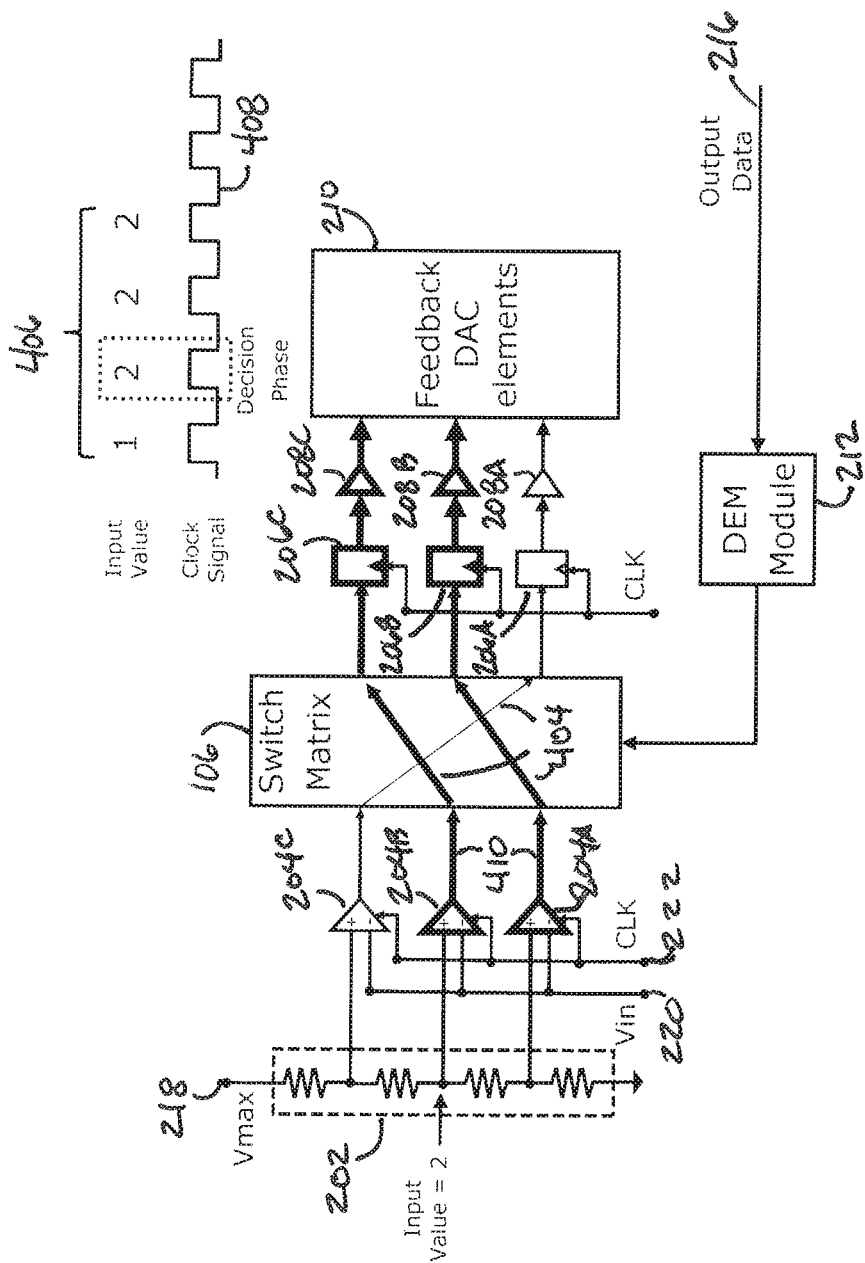

FIG. 4D is a diagram illustrating operation of the quantizer and switch matrix 106 during a second decision phase of a clock signal 408. In the second decision phase, the input value is 2, and the first and second comparators 204A and 204B determine that the input value is greater than their respective threshold values and generate active data signals 410 accordingly. The first and second comparator 204A and 204B are connected to the second and third latches 206B and 206C, respectively, by the routing 404 of the switch matrix 106 that was set in the previous reset phase. The active data signals 410 are passed through the switch matrix 106 to the second and third latches 206B and 206C, and on to the feedback DAC elements 210 for processing.

Figure 4E:
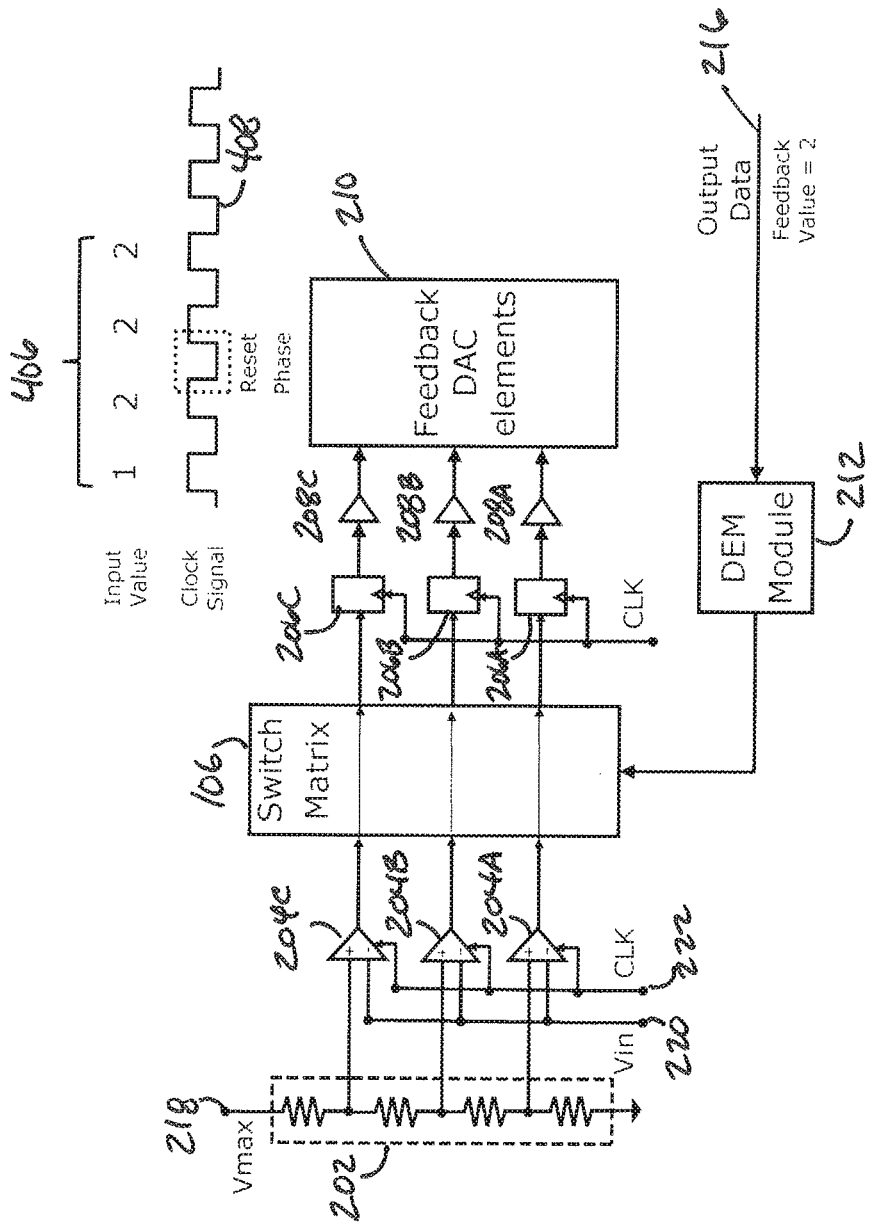

FIG. 4E is a diagram illustrating operation of the quantizer and switch matrix 106 during a reset phase of a clock signal 408. In the second reset phase, the feedback value of 2 based on the output value in the second decision phase is received at the feedback port 216 and is passed to the DEM module 212. The DEM module 212 adjusts the routing 404 of the switch matrix 106 based on the feedback value and on the previous routing used in the second decision phase. In an embodiment using the data averaging routing assignment system based on the feedback data value, the DEM module 212 may increment the connections in the switch matrix 106 by the feedback value of 2. Thus, since the previous routing 404 had the first comparator 204A connected to the second latch 206B, incrementing the routing by 2 will result in the first comparator 204A being connected to the first latch 206A since the connection assignment for the first comparator rolls over when it is incremented past the number of latches. The second and third comparators 204B and 204C are assigned to the second and third latches 206B and 206C accordingly. The data averaging routing assignment system based on the feedback data value increments the routing assignments by the number of actual active data lines, so that each latch is used a same number of times, ensuring that any errors are averaged across each element in the feedback DAC elements 210.

Figure 4F:
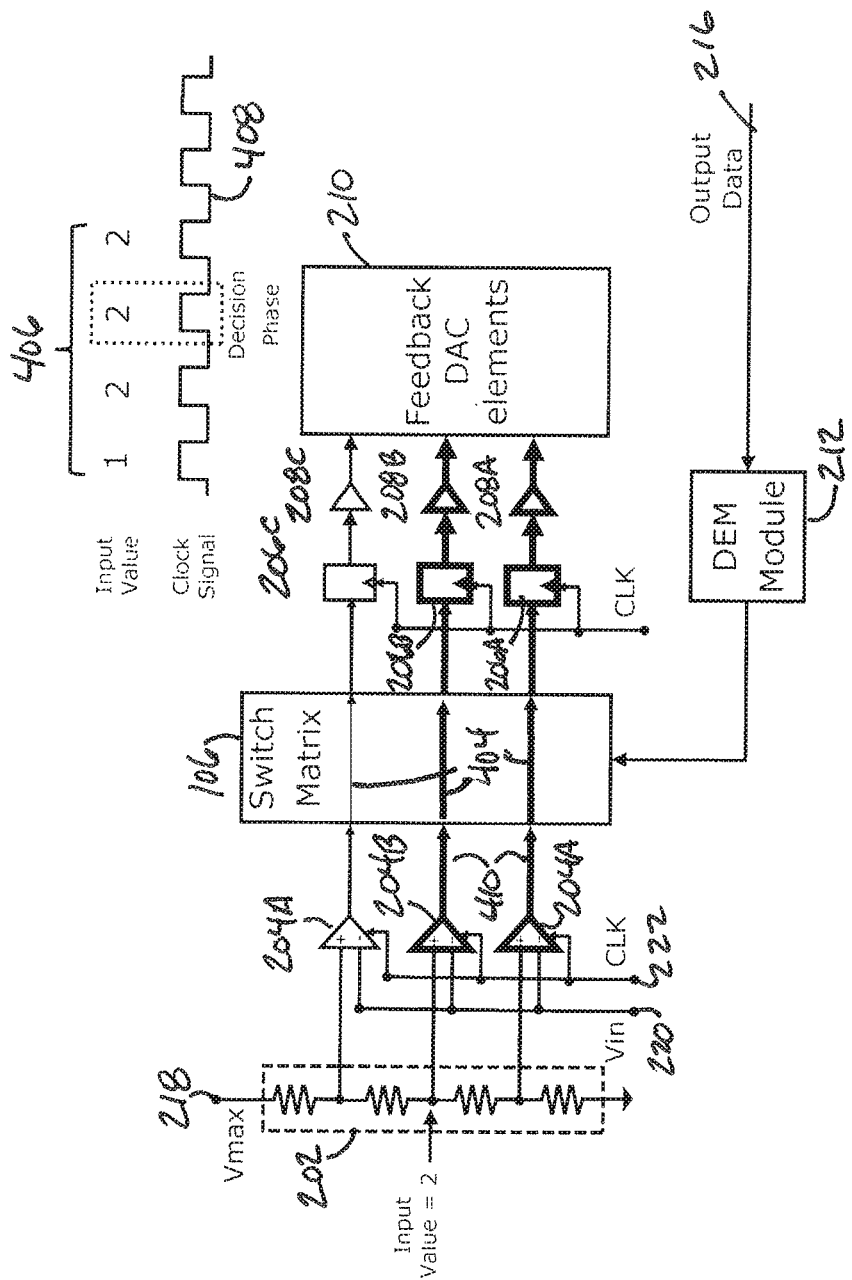

FIG. 4F is a diagram illustrating operation of the quantizer and switch matrix 106 during a third decision phase of a clock signal 408. In the third decision phase, the input value is 2, and the first and second comparators 204A and 204B determine that the input value is greater than their respective threshold values and generate active data signals 410 accordingly. The first and second comparator 204A and 204B are connected to the first and second latches 206A and 206B, respectively by the routing 404 of the switch matrix 106 that was set in the previous reset phase. The active data signals 410 are passed through the switch matrix 106 to the first and second latches 206A and 206B, and on to the feedback DAC elements 210 for processing.

Figure 4G:
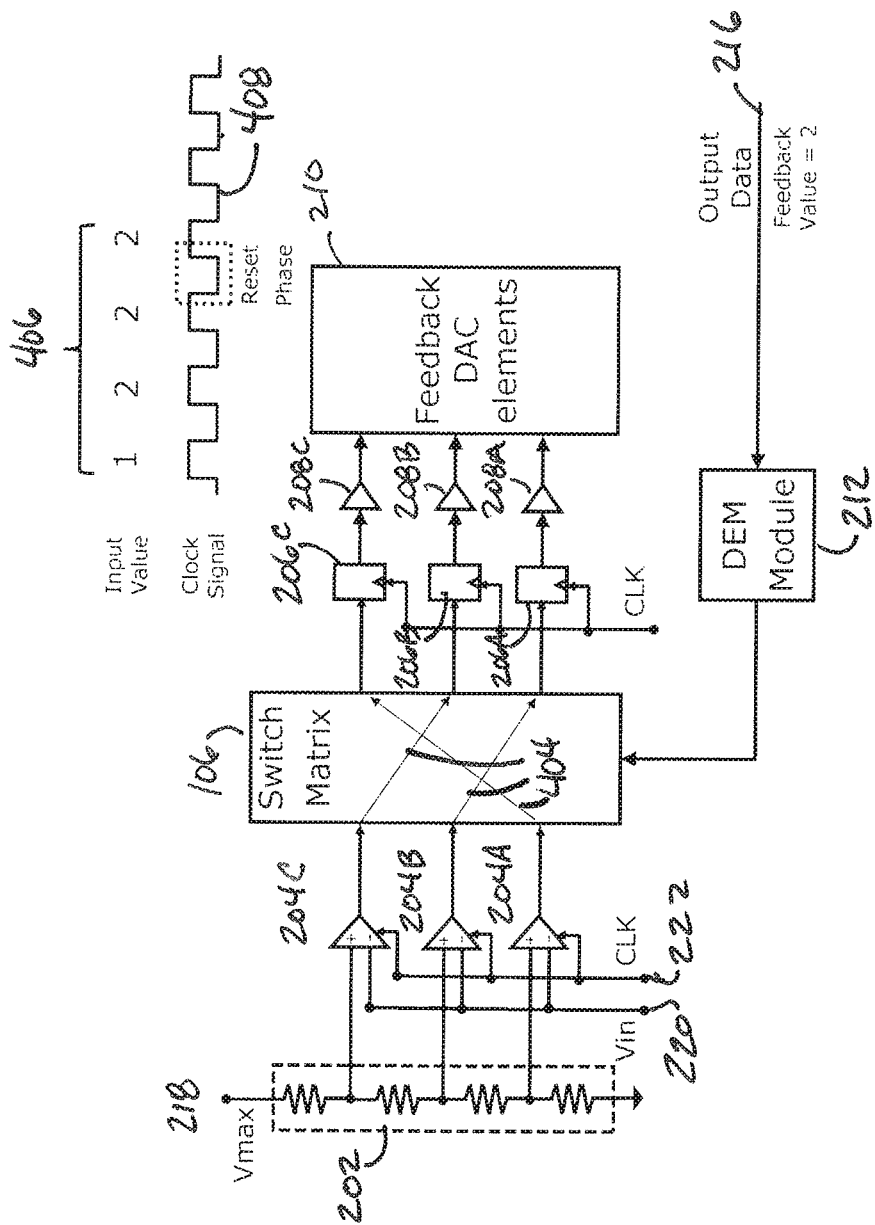

FIG. 4G is a diagram illustrating operation of the quantizer and switch matrix 106 during a reset phase of a clock signal 408. In the third reset phase, the feedback value of 2 based on the output value in the third decision phase is received at the feedback port 216 and is passed to the DEM module 212. The DEM module 212 adjusts the routing 404 of the switch matrix 106 based on the feedback value and on the previous routing used in the third decision phase. In the illustrated embodiment, the DEM module 212 uses the routing assignment system based on the feedback data value to determine that the routing assignments in the switch matrix 106 should be incremented by the feedback value of 2. Thus, since the previous routing 404 had the first comparator 204A connected to the first latch 206A, incrementing the routing by 2 will result in the first comparator 204A being connected to the third latch 206C. The second and third comparators 204B and 204C are assigned to the first and second latches 206A and 206B accordingly.

Figure 4H:
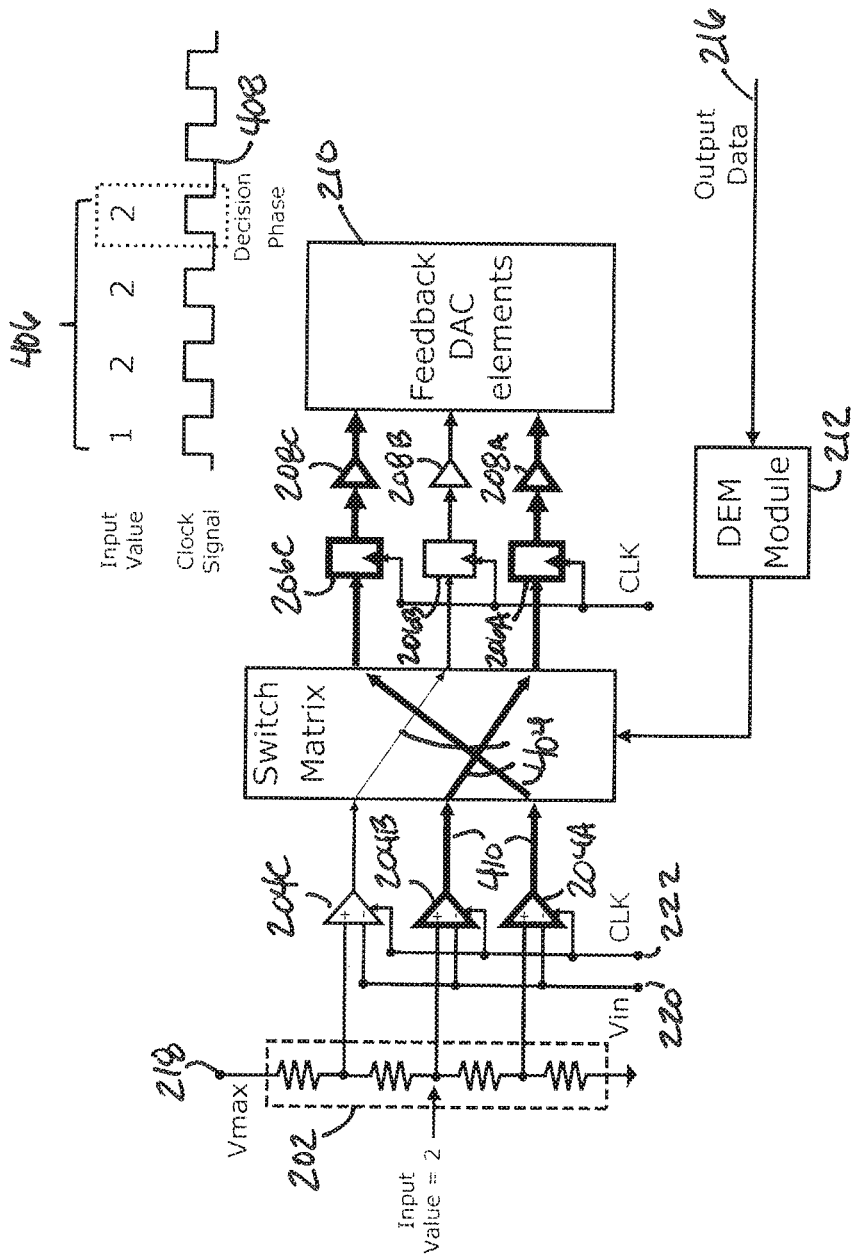

FIG. 4H is a diagram illustrating operation of the quantizer and switch matrix 106 during a fourth decision phase of a clock signal 408. In the fourth decision phase, the input value is 2, and the first and second comparators 204A and 204B determine that the input value is greater than their respective threshold values and generate active data signals 410 accordingly. The first and second comparator 204A and 204B are connected to the third and first latches 206C and 206A, respectively, by the routing 404 of the switch matrix 106 that was set in the previous reset phase. The active data signals 410 are passed through the switch matrix 106 to the third and first latches 206C and 206A, and on to the feedback DAC elements 210 for processing. The assignment of routing and handling of input values shown in FIGS. 4B through 4H may be repeated any number of times, and may be reset or restarted occasionally by setting the routing 404 to a default or initial value.

Figure 5:
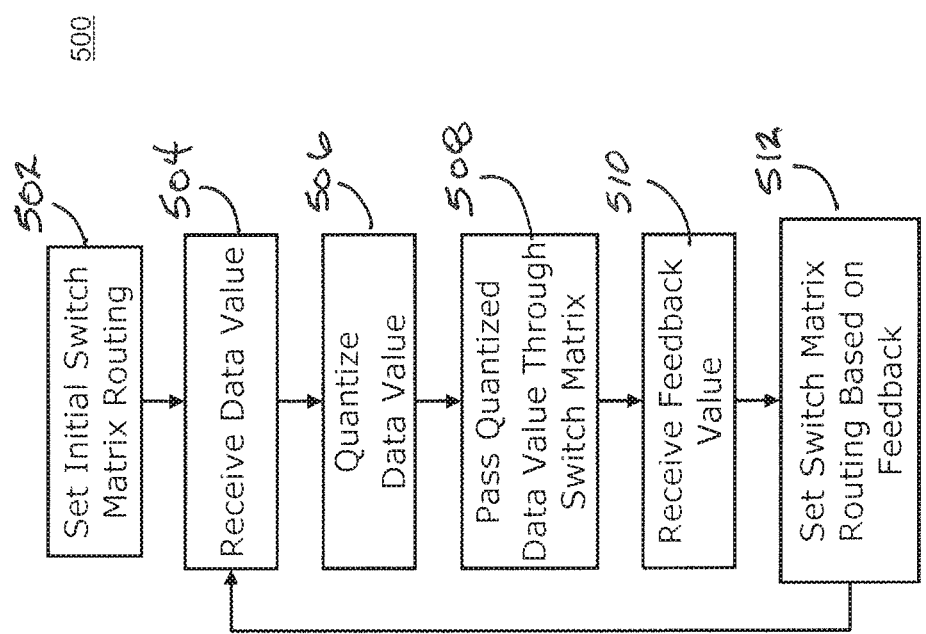
FIG. 5 is a flow diagram illustrating using a quantizer with a switch matrix according to some embodiments.

FIG. 5 is a flow diagram illustrating using quantizer with a switch matrix according to some embodiments. In block 502, an initial switch matrix routing is set. In some embodiments, DEM module sets the initial switch matrix routing. In block 504 a data value of, for an example, an input signal, is received. In block 506, the data value is quantized at the comparators. The comparators compare the signal representing the data value to respective reference signals received at the respective comparators and generate active or inactive data signals based on the results of the comparisons. In block 508, the quantized data is passed through the switch matrix and routed to the latches based on the switch matrix routing. The data is then latched and passed to the feedback DAC elements. A feedback value is received in block 510. The feedback data is received at the DEM module. In block 512 the switch matrix routing is set according to the feedback in some embodiments. In some embodiments, the switch matrix routing may also be set based on previous routing information. After setting the switch matrix routing, steps 504 through 512 may be repeated any number of times to generate a digital bitstream from an analog signal.

An embodiment ADC device includes a plurality of comparator elements, each comparator element of the plurality of comparator elements having a first input connected to an input port, each comparator element of the plurality of comparator elements having a second input port connected to a reference signal port. The ADC device further has a switch matrix having routing circuitry connected to an output of each comparator of the plurality of comparators, and a plurality of latches, with each latch of the plurality of latches having an input connected to the routing circuitry. The routing circuitry is configured to connect the output of each comparator of the plurality of comparators to an input of each latch of the plurality of latches according to one or more signals received at one or more control ports.

In an embodiment, the switch matrix has a plurality of multiplexers. Each multiplexer of the plurality of multiplexers is connected between the plurality of comparators and the plurality of latches, and a selector input of each multiplexer of the plurality of multiplexers is connected to one of the one or more control ports. In an embodiment, the switch matrix has a plurality of transistor groups, and each of the transistor groups is connected between the plurality of comparator elements and the plurality of latches. A gate of each transistor of each transistor group of the plurality of transistor groups is connected to one of the one or more control ports. In an embodiment, each of the transistor groups is connected between the output of a comparator element of the plurality of comparator elements and the inputs each of the latches of the plurality of latches. In an embodiment, the ADC device further includes a reference signal circuit that having a voltage divider circuit connected to a maximum reference voltage node. The second input port of each comparator element of the plurality of comparator elements is connected to a different node of the reference signal circuit.

An embodiment ADC device includes a symbol combiner connected to an input port, a quantizer connected to the symbol combiner, the quantizer including a plurality of comparator elements configured to determine relationships between a signal received at an quantizer input port and one or more reference signals and to generate one or more active data signals according to the relationships. The quantizer further includes a switch matrix having routing circuitry connected to each comparator element of the plurality of comparator elements, and a plurality of latches, with each latch of the plurality of latches connected to the routing circuitry. The routing circuitry is configured to connect each comparator element of the plurality of comparator elements to each latch of the plurality of latches according to one or more signals received at one or more control ports of the switch matrix. The ADC device further has a digital-to-analog converter (DAC) connected, in a first feedback loop to an output of the quantizer and to the symbol combiner, and a dynamic element matching (DEM) module connected, in a first feedback path, to the switch matrix and the output of the quantizer. The DEM module is configured to provide control signals through the one or more control ports to the switch matrix that cause the switch matrix to provide routing that connects each comparator element of the plurality of comparator elements to one respective, different, latch of the plurality of latches.

In an embodiment, the switch matrix has a plurality of switch elements, connected between the plurality of comparator elements and the plurality of latches, and a control input of each switch element of the plurality of switch elements is connected to one of the one or more control ports. In an embodiment, the DEM module is configured to provide the control signals in a current clock cycle according to a feedback data value from a previous clock cycle. In an embodiment, the DEM module is further configured to provide the control signals in a current clock cycle according to routing information from a previous clock cycle. In an embodiment, the DEM module is configured to provide the control signals according to one of a data averaging system, a random assignment system, and a round robin system. In an embodiment, the DEM module is configured to provide the control signals in a reset phase of a clock cycle and each comparator element of the plurality of comparator elements is configured to determine the relationship between the signal received at the quantizer input port and the one or more reference signals in a decision phase of the clock cycle.

An embodiment ADC device includes a plurality of comparator elements. Each comparator element is configured to generate an active data signal according to a relationship between an input signal and a reference signal. The ADC device further includes a plurality of latches, and a switch matrix having control ports and connected between the plurality of comparators and the plurality of latches, the switch matrix having routing circuitry configured to connect each comparator to each latch according to one or more control signals received at the control ports and cause the latch to latch a data value according to the data signal generated by the respective comparator connected to the latch. The ADC device further comprises a processing module connected to the latches and configured to generate a digital output signal according to the data values stored by the plurality of latches.

In an embodiment, the routing circuitry includes a plurality of switch elements, and the plurality of the switch elements is configured to connect each of the comparators to a different one of the latches. In an embodiment, each switch element is one of a multiplexer and a transistor group. In an embodiment, the ADC device further includes a dynamic element matching (DEM) module that is connected to the control ports and configured to provide the one or more control signals in a reset phase of a clock cycle. Each comparator element of the plurality of comparator elements is further configured to generate the active data signal in a decision phase of the clock cycle.

An embodiment method includes receiving, at an input of each comparator of a plurality of comparators, an input signal, quantizing a first input value of the input signal in a first clock cycle by determining a first relationship of the first input value, at each comparator of the plurality of comparators, to a respective reference signal, and generating first data signals according to the first relationships, and passing the first data signals through a switch matrix to a plurality of latches according to routing of the switch matrix. The routing connects each comparator of the plurality of comparators to a different latch of the plurality of latches, and the routing is set according to first routing information.

In an embodiment, the method further includes generating a feedback value according to the first data signals, and setting the routing in the switch matrix in a first phase of a second clock cycle according to control signals generated according to second routing information that is different than the first routing information, quantizing a second input value of the input signal in a second phase of the second clock cycle by determining a second relationship of the second input value, at each comparator of the plurality of comparators, to a respective reference signal, and generating second data signals according to the second relationships, and passing the second data signals through the switch matrix to the plurality of latches according to the routing of the switch matrix after the routing is set according to the second routing information. In an embodiment, the method further includes generating the second routing information generating according to the feedback value. In an embodiment, the method further includes generating the second routing information generating according to the feedback value and the first routing information. In an embodiment, the method further includes generating the second routing information generating according to the feedback value and the first routing information and using one of a data averaging system, a random assignment system, and a round robin system.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device, comprising:
   a plurality of comparator elements, each comparator element of the plurality of comparator elements having a first input connected to an input port, each comparator element of the plurality of comparator elements having a second input port connected to a reference signal port;
   a switch matrix having routing circuitry connected to an output of each comparator of the plurality of comparators; and
   a plurality of latches, each latch of the plurality of latches having an input connected to the routing circuitry;
   wherein the routing circuitry is configured to connect the output of each comparator of the plurality of comparators to an input of each latch of the plurality of latches according to one or more signals received at one or more control ports.

2. The device of claim 1, wherein the switch matrix has a plurality of multiplexers, wherein each multiplexer of the plurality of multiplexers is connected between the plurality of comparators and the plurality of latches, and wherein a selector input of each multiplexer of the plurality of multiplexers is connected to one of the one or more control ports.

3. The device of claim 1, wherein the switch matrix has a plurality of transistor groups, wherein each of the transistor groups is connected between the plurality of comparator elements and the plurality of latches, and wherein a gate of each transistor of each transistor group of the plurality of transistor groups is connected to one of the one or more control ports.

4. The device of claim 3, wherein each of the transistor groups is connected between the output of a comparator element of the plurality of comparator elements and the inputs each of the latches of the plurality of latches.

5. The device of claim 1, further comprising a reference signal circuit that comprises a voltage divider circuit connected to a maximum reference voltage node;
   wherein the second input port of each comparator element of the plurality of comparator elements is connected to a different node of the reference signal circuit.

6. A device comprising:
   a symbol combiner connected to an input port;
   a quantizer connected to the symbol combiner, comprising:
   a plurality of comparator elements configured to determine relationships between a signal received at an quantizer input port and one or more reference signals and to generate one or more active data signals according to the relationships;
   a switch matrix having routing circuitry connected to each comparator element of the plurality of comparator elements; and
   a plurality of latches, each latch of the plurality of latches connected to the routing circuitry, wherein the routing circuitry is configured to connect each comparator element of the plurality of comparator elements to each latch of the plurality of latches according to one or more signals received at one or more control ports of the switch matrix;
   a digital-to-analog converter (DAC) connected, in a first feedback loop to an output of the quantizer and to the symbol combiner; and
   a dynamic element matching (DEM) module connected, in a first feedback path, to the switch matrix and the output of the quantizer, wherein the DEM module is configured to provide control signals through the one or more control ports to the switch matrix that cause the switch matrix to provide routing that connects each comparator element of the plurality of comparator elements to one respective, different, latch of the plurality of latches.

7. The device of claim 6, wherein the switch matrix has a plurality of switch elements, connected between the plurality of comparator elements and the plurality of latches, and wherein a control input of each switch element of the plurality of switch elements is connected to one of the one or more control ports.

8. The device of claim 6, wherein the DEM module is configured to provide the control signals in a current clock cycle according to a feedback data value from a previous clock cycle.

9. The device of claim 8, wherein the DEM module is further configured to provide the control signals in a current clock cycle according to routing information from a previous clock cycle.

10. The device of claim 6, wherein the DEM module is configured to provide the control signals according to one of a data averaging system, a random assignment system, and a round robin system.

11. The device of claim 6, wherein the DEM module is configured to provide the control signals in a reset phase of a clock cycle and wherein each comparator element of the plurality of comparator elements is configured to determine the relationship between the signal received at the quantizer input port and the one or more reference signals in a decision phase of the clock cycle.

12. A device, comprising:
a plurality of comparator elements, wherein each comparator element is configured to generate an active data signal according to a relationship between an input signal and a reference signal;
a plurality of latches;
a switch matrix having control ports and connected between the plurality of comparators and the plurality of latches, the switch matrix having routing circuitry configured to connect each comparator to each latch according to one or more control signals received at the control ports and cause the latch to latch a data value according to the data signal generated by the respective comparator connected to the latch; and
a processing module connected to the latches and configured to generate a digital output signal according to the data values stored by the plurality of latches.

13. The device of claim 12, wherein the routing circuitry includes a plurality of switch elements, wherein the plurality of the switch elements is configured to connect each of the comparators to a different one of the latches.

14. The device of claim 13, wherein each switch element is one of a multiplexer and a transistor group.

15. The device of claim 12, further comprising a dynamic element matching (DEM) module connected to the control ports and configured to provide the one or more control signals in a reset phase of a clock cycle and wherein each comparator element of the plurality of comparator elements is further configured to generate the active data signal in a decision phase of the clock cycle.

16. A method, comprising:
receiving, at an input of each comparator of a plurality of comparators, an input signal;
quantizing a first input value of the input signal in a first clock cycle by determining a first relationship of the first input value, at each comparator of the plurality of comparators, to a respective reference signal, and generating first data signals according to the first relationships; and
passing the first data signals through a switch matrix to a plurality of latches according to routing of the switch matrix, wherein the routing connects each comparator of the plurality of comparators to a different latch of the plurality of latches, wherein the routing is set according to first routing information.

17. The method according to claim 16, further comprising:
generating a feedback value according to the first data signals;
setting the routing in the switch matrix in a first phase of a second clock cycle according to control signals generated according to second routing information that is different than the first routing information;
quantizing a second input value of the input signal in a second phase of the second clock cycle by determining a second relationship of the second input value, at each comparator of the plurality of comparators, to a respective reference signal, and generating second data signals according to the second relationships; and
passing the second data signals through the switch matrix to the plurality of latches according to the routing of the switch matrix after the routing is set according to the second routing information.

18. The method according to claim 17, further comprising generating the second routing information generating according to the feedback value.

19. The method according to claim 17, further comprising generating the second routing information generating according to the feedback value and the first routing information.

20. The method according to claim 17, further comprising generating the second routing information generating according to the feedback value and the first routing information and using one of a data averaging system, a random assignment system, and a round robin system.

* * * * *